US012300634B2

(12) United States Patent
Haba et al.

(10) Patent No.: US 12,300,634 B2
(45) Date of Patent: May 13, 2025

(54) PROTECTIVE SEMICONDUCTOR ELEMENTS FOR BONDED STRUCTURES

(71) Applicant: Invensas Bonding Technologies, Inc., San Jose, CA (US)

(72) Inventors: Belgacem Haba, Saratoga, CA (US); Laura Wills Mirkarimi, Sunol, CA (US); Christopher Aubuchon, San Jose, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 24 days.

(21) Appl. No.: 17/816,346

(22) Filed: Jul. 29, 2022

(65) Prior Publication Data

US 2023/0036441 A1    Feb. 2, 2023

Related U.S. Application Data

(60) Provisional application No. 63/203,867, filed on Aug. 2, 2021.

(51) Int. Cl.
*H01L 23/00* (2006.01)
(52) U.S. Cl.
CPC .......... *H01L 23/573* (2013.01); *H01L 23/576* (2013.01); *H01L 24/05* (2013.01); *H01L 24/08* (2013.01); *H01L 2224/05541* (2013.01); *H01L 2224/05647* (2013.01); *H01L 2224/08146* (2013.01)
(58) Field of Classification Search
CPC .................................................... H01L 23/573

USPC ............................................................ 257/48
See application file for complete search history.

(56) References Cited

U.S. PATENT DOCUMENTS

| 5,451,547 A | 9/1995 | Himi et al. |
| 5,753,536 A | 5/1998 | Sugiyama et al. |
| 5,771,555 A | 6/1998 | Eda et al. |
| 6,080,640 A | 6/2000 | Gardner et al. |

(Continued)

FOREIGN PATENT DOCUMENTS

| CN | 107946249 A | 4/2018 |
| JP | 2002-353416 | 12/2002 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Ajay Arora
(74) *Attorney, Agent, or Firm* — Knobbe, Martens, Olson & Bear LLP

(57) ABSTRACT

A bonded structure with protective semiconductor elements including a semiconductor element with active circuitry and a protective element including an obstructive layer and/or a protective circuitry layer. The obstructive layer is configured to inhibit external access to at least a portion of the active circuitry. The protective circuitry layer is configured to detect or disrupt external access to the protective element and/or the active circuitry of the semiconductor element. The semiconductor element and the protective element are directly bonded without an adhesive along a bonding interface.

29 Claims, 6 Drawing Sheets

(56) References Cited

U.S. PATENT DOCUMENTS

| | | |
|---|---|---|
| 6,180,496 B1 | 1/2001 | Farrens et al. |
| 6,423,640 B1 | 7/2002 | Lee et al. |
| 6,465,892 B1 | 10/2002 | Suga |
| 6,645,828 B1 | 11/2003 | Farrens et al. |
| 6,887,769 B2 | 5/2005 | Kellar et al. |
| 6,908,027 B2 | 6/2005 | Tolchinsky et al. |
| 6,908,832 B2 | 6/2005 | Farrens et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,489,013 B1 | 2/2009 | Chubin et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,581,108 B1 | 11/2013 | Boone et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,087,851 B2 | 7/2015 | Afzali-Ardakani et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,196,555 B1 | 11/2015 | Lower et al. |
| 9,224,704 B2 | 12/2015 | Landru |
| 9,230,941 B2 | 1/2016 | Chen et al. |
| 9,246,311 B1 | 1/2016 | Raring et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,455,233 B1 | 9/2016 | Bhooshan et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,553,056 B1 | 1/2017 | Afzali-Ardakani et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,014,429 B2 | 7/2018 | Newman et al. |
| 10,026,605 B2 | 7/2018 | Doub et al. |
| 10,026,716 B2 | 7/2018 | Yu et al. |
| 10,075,657 B2 | 9/2018 | Fahim et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,437,012 B1 | 10/2019 | Gurin |
| 10,446,456 B2 | 10/2019 | Shen et al. |
| 10,446,487 B2 | 10/2019 | Huang et al. |
| 10,446,532 B2 | 10/2019 | Uzoh et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,886,255 B2 | 1/2021 | Hong et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,196 B2 | 7/2022 | Kang et al. |
| 11,610,846 B2 | 3/2023 | Haba et al. |
| 11,728,287 B2 | 8/2023 | DeLaCruz et al. |
| 11,848,284 B2 | 12/2023 | DeLaCruz et al. |
| 2002/0003307 A1 | 1/2002 | Suga |
| 2004/0084414 A1 | 5/2004 | Sakai et al. |
| 2004/0188819 A1 | 9/2004 | Farnworth et al. |
| 2006/0057945 A1 | 3/2006 | Hsu et al. |
| 2007/0030022 A1 | 2/2007 | Kash et al. |
| 2007/0111386 A1 | 5/2007 | Kim et al. |
| 2008/0006938 A1 | 1/2008 | Patti et al. |
| 2008/0088996 A1 | 4/2008 | Bonvalot et al. |
| 2008/0251906 A1 | 10/2008 | Eaton et al. |
| 2009/0072343 A1 | 3/2009 | Ohnuma et al. |
| 2009/0246355 A9 | 10/2009 | Lower et al. |
| 2010/0032776 A1 | 2/2010 | Pham et al. |
| 2010/0171202 A1 | 7/2010 | Tian et al. |
| 2010/0190334 A1 | 7/2010 | Lee |
| 2010/0216294 A1 | 8/2010 | Rabarot et al. |
| 2010/0314149 A1 | 12/2010 | Gerrish et al. |
| 2010/0315108 A1 | 12/2010 | Fornara et al. |
| 2011/0090658 A1 | 4/2011 | Adams et al. |
| 2012/0256305 A1 | 10/2012 | Kaufmann et al. |
| 2012/0313176 A1* | 12/2012 | Frohberg .......... H01L 21/76816 |
| | | 257/E27.06 |
| 2013/0328174 A1 | 12/2013 | La Tulipe, Jr. et al. |

(56) References Cited

U.S. PATENT DOCUMENTS

| | | |
|---|---|---|
| 2014/0035136 A1 | 2/2014 | Buer et al. |
| 2014/0175655 A1 | 6/2014 | Chen et al. |
| 2014/0346685 A1 | 11/2014 | Afzali-Ardakani et al. |
| 2014/0349448 A1 | 11/2014 | Afzali-Ardakani et al. |
| 2015/0064498 A1 | 3/2015 | Tong |
| 2015/0262976 A1 | 9/2015 | Edelstein et al. |
| 2016/0132698 A1 | 5/2016 | Miyajima |
| 2016/0315055 A1 | 10/2016 | Vogt et al. |
| 2016/0343682 A1 | 11/2016 | Kawasaki |
| 2016/0377689 A1* | 12/2016 | Babulano ......... G01R 33/091 324/252 |
| 2017/0117431 A1 | 4/2017 | Afzali-Ardakani et al. |
| 2017/0190572 A1 | 7/2017 | Pan et al. |
| 2017/0200756 A1 | 7/2017 | Kao et al. |
| 2017/0373024 A1 | 12/2017 | Graf et al. |
| 2018/0061781 A1 | 3/2018 | Petitdidier et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0308808 A1 | 10/2018 | Kirschner et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075553 A1 | 3/2020 | DeLaCruz et al. |
| 2020/0118973 A1 | 4/2020 | Wang et al. |
| 2020/0135698 A1 | 4/2020 | Hong et al. |
| 2020/0227367 A1 | 7/2020 | Haba et al. |
| 2020/0235059 A1 | 7/2020 | Cok et al. |
| 2020/0249324 A1 | 8/2020 | Steinberg et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328163 A1 | 10/2020 | Best et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0335450 A1 | 10/2020 | Wang et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0210439 A1 | 7/2021 | Lim et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0115329 A1* | 4/2022 | Kantarovsky ......... H01L 23/481 |
| 2022/0134511 A1 | 5/2022 | Ankersen |
| 2022/0139849 A1 | 5/2022 | DeLaCruz et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0302048 A1 | 9/2022 | DeLaCruz et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0373593 A1 | 11/2022 | DeLaCruz et al. |
| 2023/0005850 A1 | 1/2023 | Fountain, Jr. |
| 2023/0019869 A1 | 1/2023 | Mirkarimi et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0317628 A1 | 10/2023 | Haba et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0055407 A1 | 2/2024 | Workman |
| 2024/0079351 A1 | 3/2024 | DeLaCruz et al. |
| 2024/0079376 A1 | 3/2024 | Suwito et al. |
| 2024/0096823 A1 | 3/2024 | DeLaCruz et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |

FOREIGN PATENT DOCUMENTS

| | | |
|---|---|---|
| JP | 2010-272622 A | 12/2010 |
| JP | 2013-033786 A | 2/2013 |
| JP | 2018-160519 | 10/2018 |

(56) References Cited

FOREIGN PATENT DOCUMENTS

| WO | WO 2005/043584 A2 | 5/2005 |
|---|---|---|
| WO | WO 2006/013507 A1 | 2/2006 |
| WO | WO 2020/034063 A1 | 2/2020 |

OTHER PUBLICATIONS

Bengtsson et al., "Low temperature bonding," International Conference on Compliant & Alternative Substrate Technology, Sep. 1999, p. 10.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele et al., "Semiconductor Wafer Bonding: a flexible approach to materials combinations in microelectronics; micromechanics and optoelectronics," IEEE, 1997, pp. 23-32.

International Search Report and Written Opinion mailed Jul. 29, 2020, in International Application No. PCT/US2020/027772, 8 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Knechtel, J. et al., "3D integration: Another dimension toward hardware security," 2019 IEEE 25th International Symposium on On-Line Testing and Robust System Design, Jul. 2019, 5 pages.

Lohrke, H. et al., "No. place to hide: Contactless probing of secret data on FPGAs," International Association for Cryptologic Research 2016, Gierlichs B., Poschmann A. (eds) Cryptographic Hardware and Embedded Systems—CHES 2016, pp. 147-167.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Wang et al., Probing attacks on integrated circuits: Challenges and research opportunities, IEEE Design & Test, Sep./Oct. 2017, vol. 34, No. 5, pp. 63-71.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion mailed Nov. 25, 2022, in International Application No. PCT/US2022/038921, 13 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820."

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

* cited by examiner

PROTECTIVE SEMICONDUCTOR ELEMENTS FOR BONDED STRUCTURES

CROSS REFERENCE TO RELATED APPLICATIONS

This application claims priority to U.S. Provisional Patent Application No. 63/203,867, filed Aug. 2, 2021, the entire contents of which are hereby incorporated by reference in their entirety and for all purposes.

BACKGROUND

Field

The field relates to bonded structures comprising active and/or protective semiconductor elements and methods for forming the same.

Description of the Related Art

Semiconductor chips (e.g., integrated device dies) may include active circuitry containing security-sensitive components which contain valuable and/or proprietary information, structures or devices. For example, such security-sensitive components may include an entity's intellectual property, software or hardware security (e.g., encryption) features, privacy data, or any other components or data that the entity may wish to remain secure and hidden from third parties. For example, third party bad actors may utilize various techniques to attempt to access security-sensitive components for economic and/or geopolitical advantage. Accordingly, there remains a continuing need for improving the security of semiconductor chips from being accessed by third parties.

DETAILED DESCRIPTION

Figure 1:
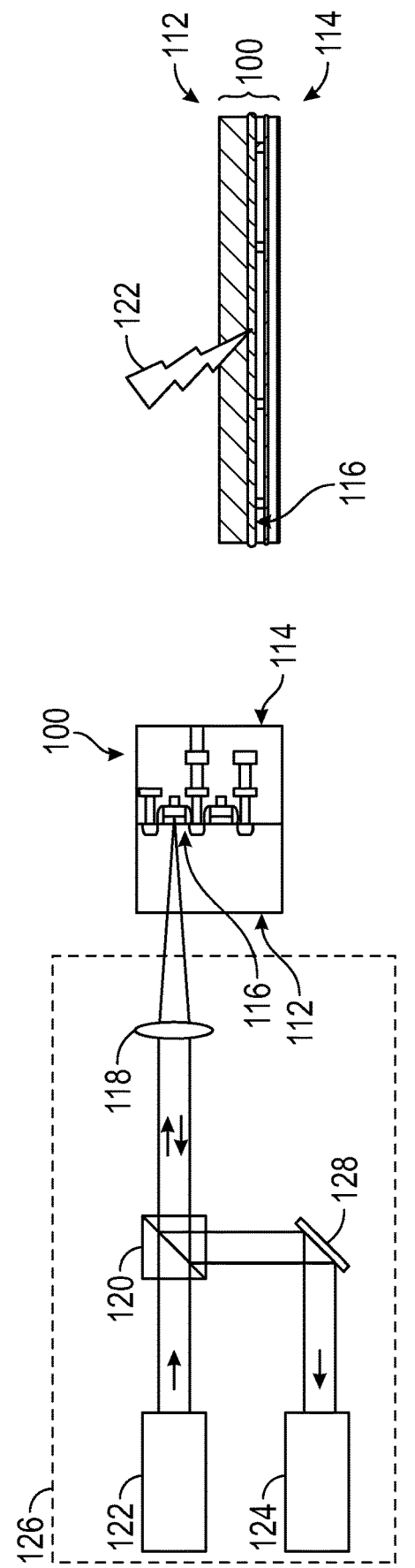
FIG. 1 is an example illustration of optical imaging of a semiconductor chip.

As explained herein, third parties (such as third party bad actors) may attempt to access security-sensitive components on elements such as integrated device dies. In some elements, the security-sensitive components may be protected by a combination of netlist and non-volatile memory (NVM) data. However, third parties may attempt to hack the security-sensitive components by a combination of destructive and non-destructive techniques, e.g., through a variety of probing techniques (e.g. electro-optical probing) and/or delayering the element to expose, reverse engineer, or otherwise gain access to the security-sensitive components. In some cases, the third party may attempt to hack the security-sensitive components by pulsing electromagnetic (EM) waves onto active circuitry of the element, using fault injection techniques, employing near infrared (NIR) laser triggering or focused ion beam (FIB) modification of circuits, chemical etching techniques, and other physical, chemical, and/or electromagnetic hacking tools and even reverse engineering. These techniques can be used to physically access sensitive circuits of microdevices such as integrated circuits to directly read encrypted information, to trigger circuits to release information otherwise encrypted, to understand manufacturing processes, to extract enough information to be able to eventually replicate sensitive designs, or to completely bypass the security protocols to activate or use the chip without due permissions. For example, in some cases hackers may attempt to access the encryption key, which can be stored in the circuit design, in memory, or in a combination of both. Techniques can also be used to indirectly read sensitive information by analyzing the resultant output based upon fault injection inputs, and through recursive analysis determine the encryption key or data contents. It is challenging to structurally protect the security-sensitive components on elements.

Accordingly, it is important to provide improved security for elements (such as semiconductor integrated device dies) that include security-sensitive components. Various embodiments disclosed herein relate to a bonded structure including a first semiconductor element bonded to a second semiconductor element. The second semiconductor element can comprise a protective element including a plurality of layers disposed over active circuitry of the first semiconductor element and arranged to inhibit interrogation of the active circuitry.

Semiconductor chips face both hardware- and software-level attacks. In some cases, these can be combined in a single technique. For example, a hardware attack on a chip may be utilized to alter the logic of a software program by providing faulty data or affecting the logic circuits used to process data.

Many techniques are employed by attackers to compromise sensitive semiconductor chips. These may include physical tampering by etching, grinding, or other deencapsulation techniques to reveal the sensitive circuits of the chip. More sophisticated attacks may further employ optical probing of the sensitive circuits. Of these, focused ion beam (FIB) and laser probing are the most prevalent. Many protective countermeasures have been used and proposed in the past, with limited effectiveness as described in more detail below.

FIG. 1 provides an overview of an optical imaging attack using laser probing. Optical probing techniques may be used to access active circuitry 116 (e.g., electronic circuitry that includes at least one transistor) of a semiconductor chip 100 that includes sensitive circuitry (e.g., circuitry that is vulnerable to a hacking attack). Optical probing techniques can enable an attacker to reconstruct sensitive circuitry, compromising the confidentiality and security of the sensitive circuitry. Optical probing techniques may be used to access active circuitry 116 from a back side 112 of the semiconductor element 100 as the optical probes 126 from the back side 112 are not blocked by any wiring or metallizations, unlike on the front side 114 of the semiconductor element 100. In the devices illustrated herein, the active circuitry 116 can be closer to the front side 114 of the semiconductor element 100 than to the back side 112 of the element 100. For example, the active circuitry 116 can be patterned at or near the front side 114 of the element 100. The optical probe 126 includes a laser source 122, a beam splitter 120, a detector 124, and an objective lens 118. The laser source 122 can create and direct a laser beam to the beam splitter 120, which can split the beam into a first component that is directed through the objective lens 118 to the semiconductor element 100 and a second component that is directed to a mirror 128 and the detector 124. The back side optical intrusion techniques can also be used to monitor activity of a circuit, collecting bitstream information to retrieve encryption keys and compromise encrypted information. Laser probing may be performed, for example, by scanning a de-encapsulated chip with a near-infrared (NIR) laser to both image the circuits on the chip and capture waveform information of an active chip. By capturing variance in reflectivity of a circuit path over time caused by the shifting electromagnetic field of the circuit path, laser probing can be used to capture and reconstruct sensitive bitstream information. In some cases, laser probing may be intended to activate specific sets of sensitive transistors or circuits within a chip, which once activated during this type of hack may emit a small amount of IR that is in turn captured by the detector to identify the exact location of interest to hackers. In some cases, this attack may be used to compromise encryption keys. Additionally, imaging of sensitive circuits may allow an attacker to reconstruct sensitive algorithms and other data.

Preventing optical intrusion is thus important to ensuring the security of semiconductor chips containing security-sensitive components. Conventional techniques may include packaging semiconductor elements with protective casings. However, conventional packaging may be susceptible to grinding, chemical etching, and other package decapping processes that are relatively unsophisticated, leaving the sensitive circuitry exposed and susceptible to optical probing. It may thus be desirable to include protection against optical intrusions by bonding one or more protective elements directly to a semiconductor element, e.g., an active chip having active circuitry 116 including sensitive circuitry. Semiconductor elements 100, such as integrated device dies or chips, may be mounted or stacked on other elements. For example, a semiconductor element 100 can be mounted to a carrier, such as a package substrate, an interposer, a reconstituted wafer or element, etc. As another example, a semiconductor element 100 can be stacked on top of another semiconductor element 100, e.g., a first integrated device die can be stacked on a second integrated device die. In some arrangements, a through-substrate via (TSV) can extend vertically through a thickness of the semiconductor element 100 to transfer electrical signals through the semiconductor element 100, e.g., from a first surface of the semiconductor element 100 to a second opposing surface of the semiconductor element 100.

To prevent optical imaging of a sensitive semiconductor chip 100, protective elements may thus be integrated into the chip itself, such as an occlusive or abrasive layer disposed over the sensitive semiconductor layer. Direct bonding of obstructive layers may be effective against conventional de-encapsulation techniques, preventing exposure of the sensitive circuit layers of the chip from grinding or etching. However, invasive attacks may be used to thwart these protective measures. As stated, many techniques are employed by attackers to compromise sensitive semiconductor chips. For example, hackers can recreate 2D activity maps of the active circuitry 116 by laser probing the chip. Further, an imaging attack may be utilized to break the bitstream encryption information found within. Thus the protective semiconductor elements described herein block or alter the reflected optical signals (e.g. IR) to help improve the security of the chip (e.g. semiconductor element 100) against non-contact tampering.

Figure 2:
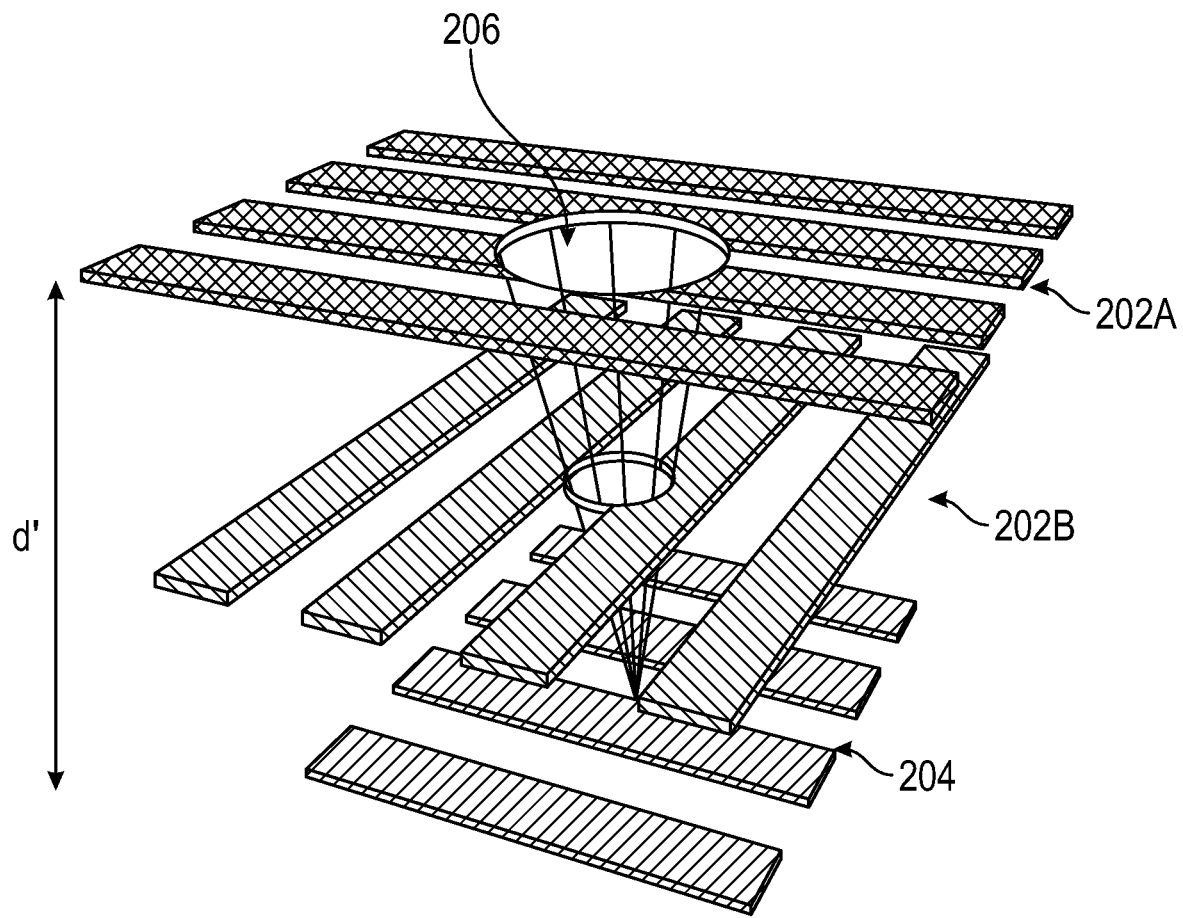
FIG. 2 is an example illustration of a focused ion beam (FIB) attack of a semiconductor chip.

FIG. 2 illustrates an example FIB attack. FIB attacks may use a focused ion beam to ablate the surface of a de-encapsulated chip layer by layer, eliminating the protective elements to expose the sensitive semiconductor layer. For example, as shown in FIG. 2, a target wire 204 may be exposed by ablation of intervening protective wires 202A, 202B. Ablation using the focused ion beam can form a hole 206 through the chip and protective wires 202A, 202B in a conical pattern having a depth d'. An FIB may then be used at lower intensity to provide high-precision imaging of the sensitive layers (e.g. wire 204). Additionally, the FIB may be used to alter the function of active chips, by inducing current flows, severing or altering traces that connect elements of the sensitive circuit. This may allow an attacker to modify and/or bypass protective structures within the sensitive semiconductor layer. Further, an FIB or laser probe may be used subsequent to ablation to capture bitstream information or image sensitive circuit elements.

With this invasive physical attack, hackers may access and directly monitor security critical nets of an IC and extract sensitive information. Attacks such as these typically happen on the front side of the chip but may also occur on the backside.

Figure 3:
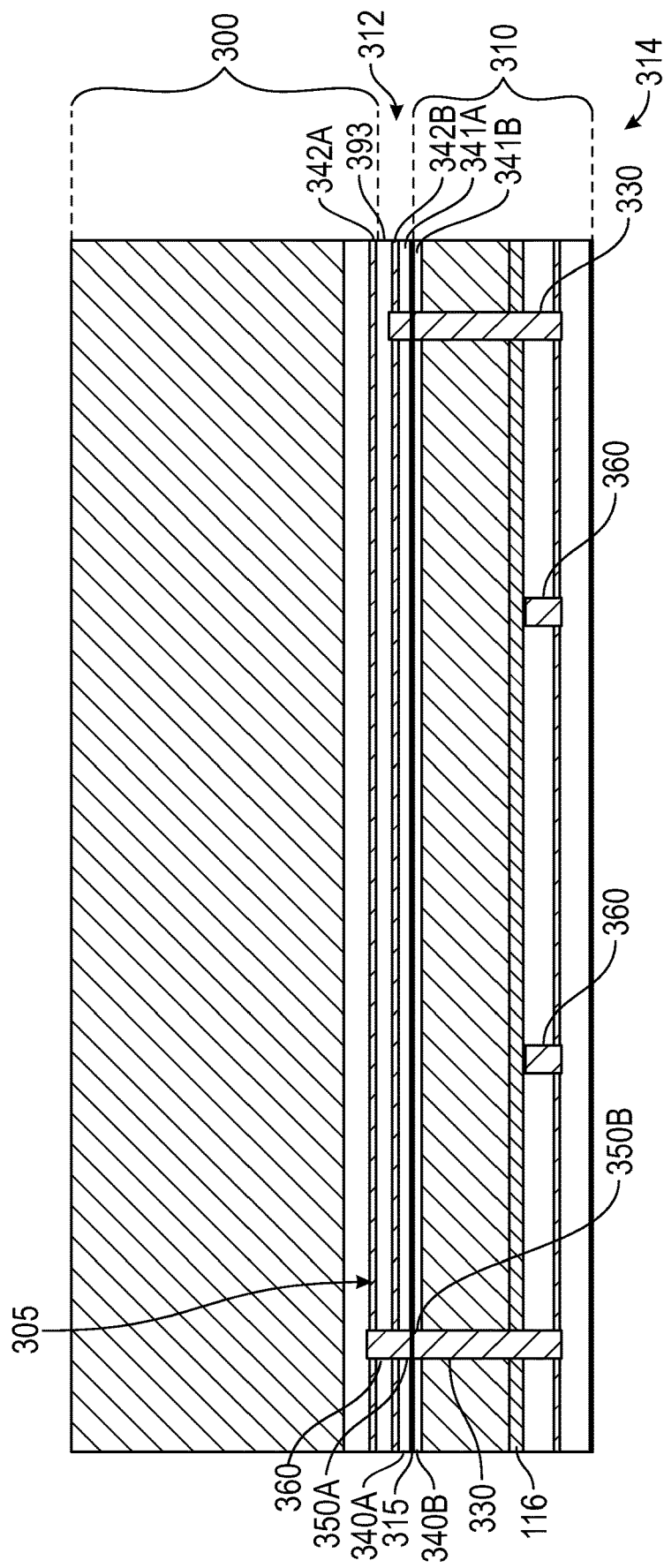
FIG. 3 is a schematic side sectional view showing an example solution to invasive chip attacks.

FIG. 3 shows an illustrative example of protective measures employed to thwart imaging attacks of sensitive semiconductor chips. As shown in FIG. 3, an active chip 310 may be bonded (e.g., directly bonded without an adhesive) to a protective chip 300 containing an obstructive layer 305. As shown, the protective chip 300 can be directly bonded to aback side 112 of the active chip 310 that is opposite the front side 114 (which can comprise an active side nearer to the active circuitry 116 than the back side 112). In some configurations, the obstructive layer 305 may be an optically-occlusive layer designed to prevent laser probing, FIB or other hacking techniques of the active circuit layer 116 of the active chip 310, such as described in U.S. patent application Ser. No. 17/812,675, filed Jul. 14, 2022, the entire contents of which are hereby incorporated. As shown in FIG. 2 above, this provides limited protection against FIB attacks. A motivated attacker may, for example, identify a target region 204 of the active chip 310 and employ an FIB attack to remove the portions of the obstructive layer 305 covering the target area 204 of the chip 310, leaving it exposed to probing.

The obstructive layer 305 can comprise several layers, such as a plurality of metallized layers (e.g. 342A,B) spaced apart by an insulating material 343. In some embodiments, the metallized layers 342A,B and intervening insulating material 343 form a capacitive circuit with positive and negative terminals respectively connected to the two illustrated through-substrate vias (TSVs) 330.

As shown, a bond interface 315 may comprise a bond between a bonding layer 340A of the protective chip 300 and a bonding layer 340B of the active chip 310. The direct bond may comprise a nonconductive non-adhesive bond in which nonconductive layer 341A, 341B (e.g., dielectric materials) of the bonding layer 340A,B are directly bonded to one another. As show, the protective chip 300 is bonded to the backside 312 of the active chip 310. Further, the obstructive layer 305 is located near the bonding layer 340A of the protective chip 310. In some embodiments, the direct bond may comprise a hybrid bond in which conductive contact features 350B of the active chip 310 are directly bonded to corresponding conductive contact features 350A of the protective chip 300, and in which nonconductive regions (e.g., nonconductive layer 341B) of the active chip 310 are directly bonded to corresponding nonconductive regions (e.g., a nonconductive layer 341A) of the protective chip 300. Further, the bonding layer 340A, 340B of each chip 300, 310 may comprise a plurality of conductive contact features 350A, B disposed in a nonconductive layers 341A, 341B, such as a dielectric layer (e.g., silicon oxide, silicon nitride, silicon oxynitrocarbide, etc.) The conductive contact features 350A, B may comprise conductive material, e.g., a metal such as copper prepare for direct hybrid bonding. The conductive contact features 350A of the protective chip 300 may be configured to mirror and/or correspond to the conductive contact features 350B of the active chip 310. The pads may provide an electrical and/or mechanical connection between the protective and active chips. As used herein, the pads can comprise exposed ends of through substrate vias (TSVs) 330 or vertical interconnects 330 (e.g., labeled as pad 350A) or discrete pads at least partially embedded in the field region (e.g., labeled as pad 350B).

In some cases, an active chip 310 may be configured to detect alteration of a protective chip 300. For example, as shown in FIG. 3, a protective chip 300 may be electrically connected to the active circuitry 116 of an active chip 310 by through-substrate vias (TSVs) 330 that may enable the active chip 310 to sense changes to the properties of the protective chip 300 caused by removal of material from the obstructive layer 305. In some embodiments the protective chip 300 may be electrically connected to the active chip 310 through a direct hybrid bond or other interconnect technology. The active chip 310 may be configured to measure the resistance or the capacitance of the obstructive layer 305 or other structures built within the protective chip. If a substantial change to the obstructive layer 305 or the structures takes place, the active chip 310 may then sense the change and disable sensitive circuit elements. However, a FIB attack may be very precise, and the portion of an obstructive layer 305 ablated by the FIB may be too small to create a measurable change in the electrical properties of the obstructive layer 305. Embodiments of the present disclosure are directed at bonded structures including protective chips 300 comprising protective layers resistant to invasive attacks bonded directly to active chips 310 that may comprise security-sensitive circuitry or circuit elements.

Figure 4A:
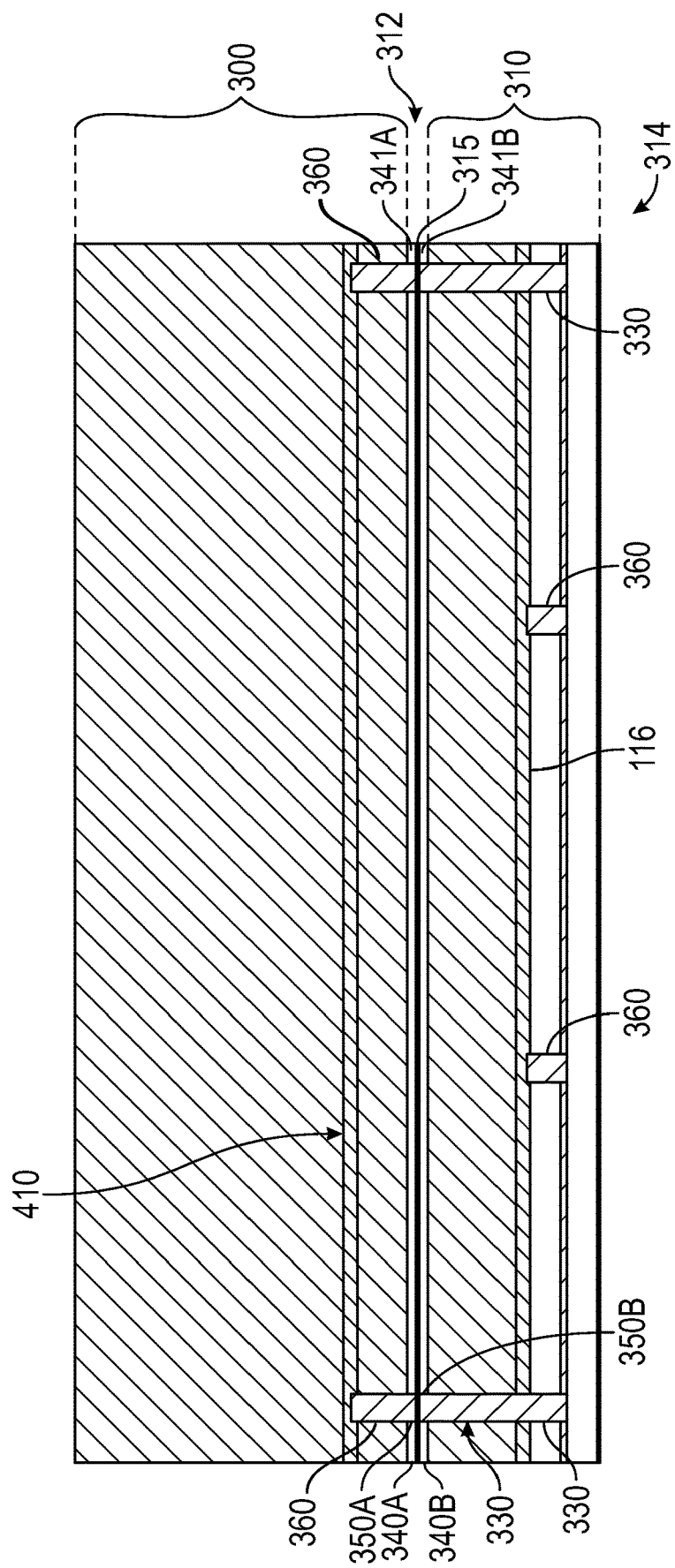
FIG. 4A is a schematic side sectional view showing an example illustration of a protective chip incorporating a protective layer.
Figure 4B:
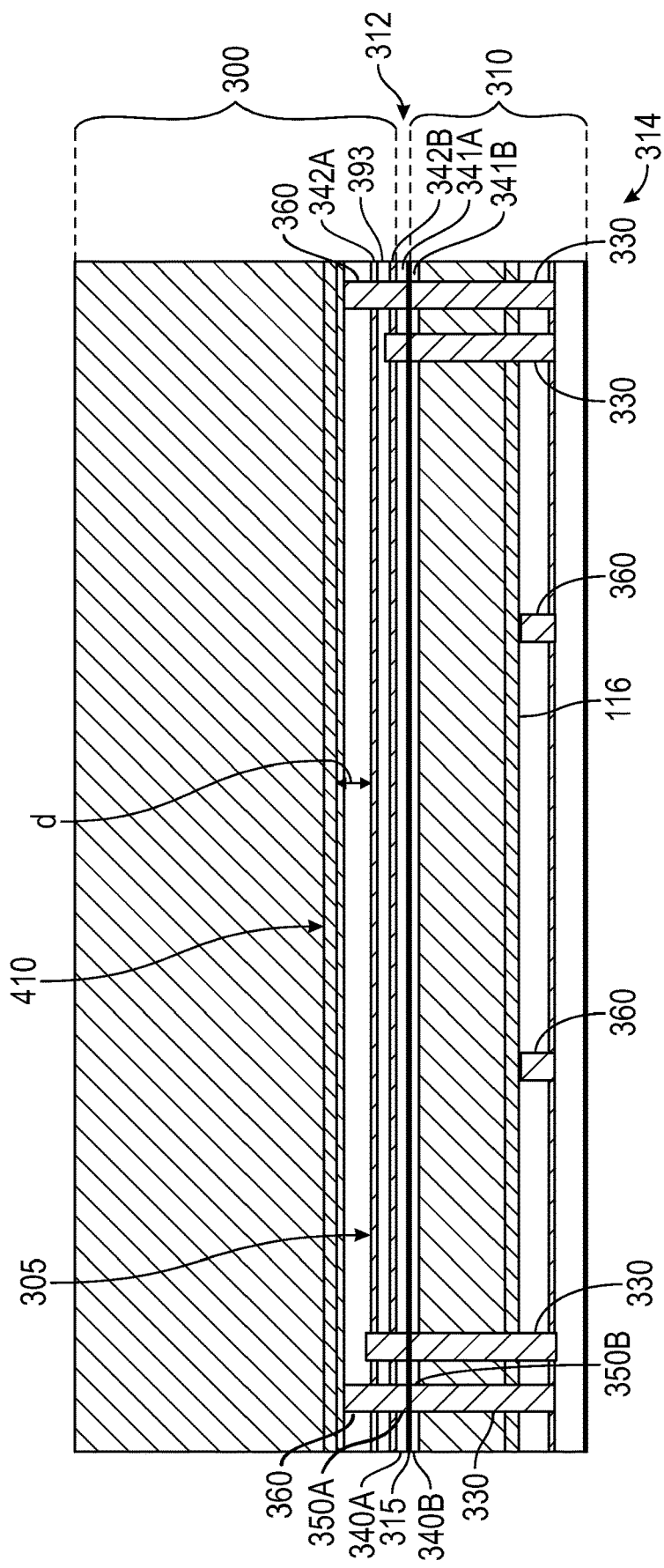
FIG. 4B is a schematic side sectional view showing an example illustration of a protective chip incorporating a protective layer in conjunction with an obstructive layer.

FIG. 4A illustrates an example embodiment of the present disclosure directed at remedying the shortcomings of other solutions to protecting sensitive semiconductor chips 100 from sophisticated intrusions employing optical and/or invasive FIB attacks. As shown in FIGS. 4A and 4B, embodiments of the present disclosure may include a protective chip 300 comprising a protective circuitry layer 410, the protective chip 300 directly bonded to the active chip 310 (e.g., to the back side 112 of the chip 310). The protective circuitry layer 410 can be configured to detect or disrupt external access to the protective element and/or the active circuitry of the semiconductor element. In some embodiments, for example as shown in FIG. 4B, the disclosed embodiments can include an obstructive layer 305 and a separate protective circuitry layer 410, formed in the protective chip 300 which can be directly bonded to an active chip 310 (e.g., the back side 112 of the chip 310) to protect an active circuitry 116 of the active chip 310. The active circuitry 116 is located near the front side 114 of the active chip 310 in the illustrated embodiment. As described above, non-bonded protective structures may be susceptible to removal via relatively easy removal techniques, such as grinding or etching. It may therefore be desirable to incorporate a protective chip 300 and active chip 310 into a bonded structure.

In some embodiments, a bond interface 315 may comprise a bond between a bonding layer 340A of the protective chip 300 and a bonding layer 340B of the active chip 310, which in the illustrated embodiments may be formed at or at least partially define the back side 112 of the chip 310. In some embodiments, the direct bond may comprise a nonconductive non-adhesive bond in which nonconductive material(s) (e.g., dielectric and/or semiconductor materials 341A,B) of the elements are directly bonded to one another. In the illustrated embodiment, the direct bond may comprise a hybrid bond in which conductive contact features or pads 350A of the active chip 310 are also directly bonded to corresponding conductive contact features 350B of the protective chip 300, and in which nonconductive regions (e.g., a bonding layer 340B) of the active chip 310 are directly bonded to corresponding nonconductive regions (e.g., a bonding layer 340A) of the protective chip 300. As shown in FIG. 4A, the bonding layer 315 of each chip may comprise a plurality of contact pads 350 disposed in a nonconductive material, such as a nonconductive or dielectric layer 341 (e.g., silicon oxide, silicon nitride, silicon oxynitrocarbide, etc.). The contact pads 350 may comprise conductive material, e.g., a metal such as copper. In these embodiments, the contact pads 350 of the protective chip 300 may be configured to mirror and/or correspond to the contact pads 350 of the active chip 310. The pads 350 may provide an electrical and/or mechanical connection between the protective 300 and active chips 310. Likewise, the contact pads 350 of the bonding layer 315 of the active chip 350 may be connected to the active circuitry 116 of the active chip 310 through TSVs 330. By bonding the contact pads 350A of the protective chip 300 to corresponding contact pads 350B of the active chip 310, in some embodiments the bonded structure may thus have an electrical connection between the active circuitry 116 of the active chip 310 and one or more layers of the protective chip 300. For example, a protective chip 300 may have vertical connectors (e.g. vertical interconnects) 360 providing electrical connections between the protective circuitry layer 410 and the contact pads 350 of the bonding layer 315. The protective circuitry layer 410 of the protective chip 300 may then be configured to communicate through the TSVs 330 to the active layer 116 of the active chip 310 across the bond interface.

As shown in FIG. 4A, the protective chip 300 may comprise a protective circuitry layer 410. The protective circuitry layer 410 described herein can be configured to detect or disrupt external access to at least one of the protective chip 300 and the active circuitry 116 of the active chip 310. In some embodiments, for example, the protective circuitry layer 410 may comprise circuitry, such as throwaway logic, that provides no functional processing to the active chip 310, but that may be configured to detect an intrusion by a hacker in order to protect the active circuitry 116 of the chip 310. In these embodiments, the circuitry in the protective circuitry layer 410 may be configured to mimic the appearance of sensitive active circuitry. For example, a protective chip 300 may incorporate a protective circuitry layer 410 comprising non-sensitive circuits to waste an attacker's time and prolong the analysis required to identify the sensitive areas of the active chip 310, which can disrupt external access to the active circuitry 116 of the chip 310. The protective circuitry layer 410 of the protective chip 300 shown herein may comprise an active circuitry layer. In such embodiments, the active protective circuitry layer 410 may comprise at least one transistor, e.g., a plurality of transistors. In these embodiments, the protective circuitry layer 410 may contain circuits to provide additional, non-sensitive functionality to the active chip 310. In some embodiments, the inexpensive active circuitry in the protective circuitry layer 410 on the protective chip 300 may provide misleading or confusing data to an optical attack as the laser probe is reflected not from the active chip 310 that is to be protected but by the inexpensive low-logic circuitry in the protective circuitry layer 410 on the protective chip 300, which can disrupt external access to the chip 310. In these embodiments, an attacker employing FIB to drill down to the active chip 310 may cause the active chip 310 to disable or malfunction by ablating the intervening protective circuitry layer 410 of the protective chip 300. If one or more transistors of the protective circuitry layer 410 are destroyed or otherwise altered, the protective circuitry 410 can detect the external access and can transmit an alert to the active circuitry 116 of the chip 310 indicating an intrusion. In response, the active chip 310 can disable the functionality of the chip 310, cause the active circuitry 116 to self-destruct or be inactive, or to otherwise prevent external access to the circuitry 116. In some embodiments the protective circuitry layer 410 may comprise active circuitry configured to provide a signal or feedback to the active circuitry 116 of the active chip 310. In these embodiments, any errors introduced into the protective layer 410 via ablation from an FIB may cause the signal from the protective layer 410 to cease or change, alerting the active chip 310 that the protective chip 300 has been tampered with. For example, the protective layer 410 may comprise active circuitry configured to provide an encrypted timing signal to the active chip 310. If the encrypted timing signal is modified by an external intrusion attempt, the active chip 310 can be alerted to the external access.

In the illustrated embodiments, the active circuitry of the protective circuitry layer 410 may comprise one or more transistors. In various embodiments, the operational processing circuitry of the active chip 310 can use advanced processes for forming the transistors used in the active chip 310, while the active circuitry of the protective chip 300 (e.g., in the protective circuitry layer 410) can be fabricated using less expensive and less advanced processing technologies, since the protective chip 300 may only utilize basic functionality without the need for advanced circuitry. As an example, the operational processing circuitry 116 of the active chip 310 can use advanced processes, such as an advanced, sub-22 nm node process. By contrast, the active circuitry layer of the protective circuitry layer 410 of the protective element 300 or chip may comprise transistors using a legacy node process with larger feature sizes, such as 65 nm and larger. In the illustrated embodiments, the protective circuitry layer 410 can be disposed within (e.g., entirely within) the body of the protective element 300. In some embodiments, the transistors in the protective element 300 may serve to provide a warning to the active chip 310 when the protective chip 300 has been tampered with. In some embodiments, the active circuitry (e.g., including one or more transistors) in the protective circuitry layer 410 of the protective element 300 may initiate or cause the sensitive circuitry 116 of the active chip 310 to stop working or functioning in a normal manner. Thus, the protective circuitry 410 inhibits ablative attacks from an FIB. The protective materials used in the protective chip 300, including the materials used in the obstructive layer 305 and protective circuitry layer 410, may include but are not limited to the protective materials described in U.S. patent application Ser. No. 16/844,932, filed Apr. 9, 2020, U.S. patent application Ser. No. 16/844,941, filed Apr. 9, 2020, U.S. patent application Ser. No. 16/881,621, filed May 22, 2020, and U.S. patent application Ser. No. 16/846,177, filed Apr. 10, 2020, the entire contents of each of which are incorporated by reference herein in their entirety and for all purposes.

As shown in FIG. 4B, the protective chip 300 may further comprise an obstructive layer 305 separate and spaced apart vertically from the protective circuitry layer 410. In some embodiments, the obstructive layer 305 may comprise a plurality of metallization layers 342A,B, separated by an insulation layer 343, that renders the layer 305 opaque to the radiation of a laser probe. In other embodiments, the obstructive layer 305 may comprise an optical filter. In order to increase the cost of analyzing a sensitive chip, it may be desirable to provide misleading or confusing data to an attacker in order to slow the analysis process. In lieu of merely blocking optical signals, it may thus be beneficial to alter the signals. An optical filter may be used to alter the optical signal. For example, in some embodiments an optical filter may comprise a refractive filter. In these embodiments, the obstructive layer 305 may cause an attacker's laser probe to generate inaccurate measurements. As described in U.S. application Ser. No. 17/812,675, which is incorporated by reference herein, the obstructive layer can change the direction of an incoming or outgoing beam (e.g. refract), focus or de-focus (e.g. lensing) the beam, scatter the beam, diffuse the beam, diffract the beam (e.g., a grating), phase/wavelength shift the beam, etc. Thus, the metallization layers 342A,B refer to light-blocking or light-modifying materials that block or modify incident light utilized when attempting to hack sensitive circuitry.

In some embodiments, the connective contact pads or features (e.g. 350A) of the bonding layer 315 of the protective chip 300 may be further connected by through-semiconductor vias vertical connectors 360 to one or more occlusive layers of the protective chip 300, as shown in the embodiment of FIG. 4B. Additionally or alternatively, as shown in FIG. 4B, an obstructive layer 305 of the protective chip 300 may be connected to the active layer 116 of the active chip 310 and/or a protective circuitry layer 410 of the protective chip 300. For example, the obstructive layer 305 of the protective chip 300 may be electrically connected to the protective layer 410 of the protective chip 300 by one or more vertical interconnects 360.

FIG. 4B shows the obstructive layer 305 electrically connected to the circuitry 116 of the active chip 310 by way of the contact pads 350A, 350B and TSVs 330 formed in the active chip. In some embodiments, the obstructive layer 305 may further comprise a detection circuit. In these embodiments, the active chip 310 may be configured to respond to changes to one or more properties of the detection circuit in the obstructive layer 305 through the TSVs 330. In some embodiments, the detection circuit may be configured to enable detection of the resistance of the obstructive layer 305 or a part of the obstructive layer 305 of the protective chip 300. Additionally or alternatively, the detection circuit may be configured to enable detecting the capacitance of the obstructive layer 305 or a part of the obstructive layer 305 of the protective chip 300. In these embodiments, the active chip 310 may be able to respond to removal of sufficiently large portions of the protective chip 300. For example, an FIB probe may be used to ablate portions of the obstructive layer 305 of the protective chip 300 to expose the sensitive semiconductor layer of the active chip 310. By removing these portions of the protective chip 300, the FIB may alter the capacitance and/or resistance or impedance of the obstructive layer 305 of the protective chip 300 to a degree detectable by the detection circuits. In these embodiments, the active chip 310 may be configured to shut down when it detects changes to the obstructive layer 305 of the protective chip 300. Additionally or alternatively, the active chip 310 may be configured to emit an alert signal when it detects changes to the obstructive layer 305 of the protective chip 300. The obstructive layer 305 of the protective chip 300 may be additionally or alternatively connected to the protective circuitry layer 410 of the protective chip 300 by additional vertical connectors 360. In these embodiments, the protective layer 410 of the protective chip 300 may be further configured to respond to changes to the properties of the obstructive layer 305 of the protective chip 300. In some embodiments, the protective circuitry layer 410 of the protective chip 300 may be configured to disable the active chip 310 when changes to the protective chip 300 are detected.

As shown in FIG. 4B, the obstructive layer 305 of the protective chip 300 may be disposed between the protective layer 410 of the protective chip 300 and the active layer 116 of the active chip 310. It should be understood by one skilled in the art that this is for illustrative purposes only. In other embodiments, the protective layer 410 of the protective chip 300 may be between an obstructive layer 305 of the protective chip 300 and the active layer of the active chip 310. Further, in some embodiments the protective chip 300 may have multiple protective layers 410. Additionally or alternatively, the protective chip 300 may have multiple obstructive layers 305. In these embodiments, the layers may be disposed in the protective chip 300 in any order. As shown, the protective chip 300 is bonded to the backside 112 of the active chip 310. In some embodiments, the protective circuitry layer 410 of the protective element 300 and the obstructive layer 305 of the protective element 300 are spaced apart (i.e. distance d) from one another along a direction transverse to the bonding interface 315. In some embodiments, the obstruction layer 305 may be located on either the protective chip 300, the active chip 310, or both.

Figure 5:
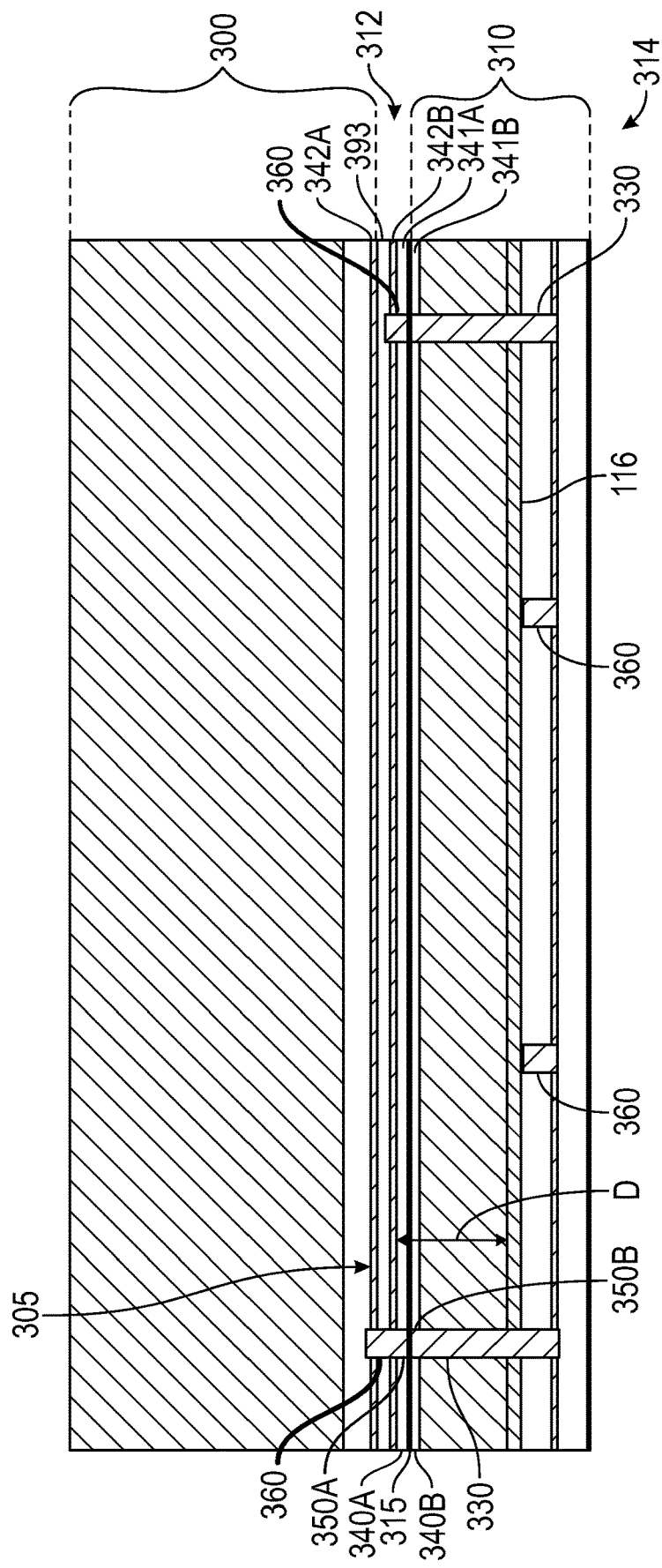
FIG. 5 is an example illustration of additional parameters of a protective chip.

FIG. 5 illustrates additional considerations in the configuration of the protective chip 300. As described in more detail above, the precision of an FIB may enable an attacker to drill through an obstructive layer 305 of a bonded structure without ablating a detectable portion of the obstructive material. However, the aspect ratio of FIBs is fairly shallow. Consequently, as shown in FIG. 2 above, the FIB widens as the distance from the focal point increases. As shown in FIG. 5, in order to ensure an FIB attack is detectible, in some embodiments the obstructive layer 305 of the protective chip 300 may be disposed at a minimum distance (i.e. D) from the sensitive semiconductor layer 116 of the active chip 310, where distance D describes a distance transverse to the bonding interface 315. This may ensure that an FIB attack used to expose a portion of the active chip 310 will ablate sufficient material of the obstructive layer 305 of the protective chip 300 to be detectable. In some embodiments, the spacing or distance D between the obstructive layer 305 of the protective element 300 and the active circuitry 116 of the semiconductor element or active chip 310 is at least 20 micrometers. In some embodiments, the distance D can be between 20 micrometers and 100 micrometers, for example, between 50 micrometers and 100 micrometers. In some embodiments, the distance D can be between 100 micrometers and 500 micrometers. In some embodiments, the protective chip 300 may also comprise a protective circuitry layer 410 comprising an active circuitry layer. In these embodiments, the protective element 300 may be contain circuits to provide additional, non-sensitive functionality to the active chip 310. Further, in some other embodiments the protective chip 300 may comprise multiple obstructive layer 305s. In addition to adding distance between the top obstructive layer 305 and the active layer 116 of the active chip 310, in these embodiments an FIB attack would need to ablate through the multiple obstructive layers 305 in order to expose the sensitive semiconductor layer (e.g., active circuitry 116) of the active chip 310. Accordingly, in various embodiments the obstructive layer 305 of the protective chip 300 may be disposed at a minimum distance from the semiconductor layer of the active chip 310, as the increased distance D requires increased ablation of the protective chip 300. An advantage of including protective circuitry (e.g., active circuitry including transistors and/or passive circuitry such as a capacitor) in the protective element is that this may force a counterfeiter to make a larger hole when ablating the material of the protective element, which in turn will increase the chance of triggering a warning to the active chip 310.

Although the illustrated embodiments herein (e.g. FIGS. 3-5) show the protective element 300 bonded to the back side 112 of the semiconductor element 310, in other embodiments, the protective element 300 can additionally or alternatively be bonded to the front side 314 to provide front side protection of the circuitry. Accordingly, in some embodiments, the bonded structure may include a second protective element 300 directly bonded to a front side of the semiconductor element 310 without an adhesive along a second bonding interface 315, the second protective element 300 including a second obstructive layer 305 configured to inhibit external access to at least the frontside 114 of the semiconductor element 310; and a second protective circuitry layer 410 disposed within the protective element 300, the protective circuit layer 410 configured to detect or disrupt external access to the front side 114 of the semiconductor element 300.

Examples of Direct Bonding Methods and Directly Bonded Structures

Various embodiments disclosed herein relate to directly bonded structures in which two elements can be directly bonded to one another without an intervening adhesive. Two or more semiconductor elements (such as integrated device dies, wafers, etc., e.g. elements 300, 310) may be stacked on or bonded to one another to form a bonded structure. Conductive contact features or pads (e.g. 350A,B) of one element may be electrically connected to corresponding conductive contact features (e.g. 350A,B) of another element. Any suitable number of elements can be stacked in the bonded structure.

In some embodiments, the elements are directly bonded to one another without an adhesive. In various embodiments, a non-conductive or dielectric material (e.g. 341A) of a first element (e.g., a protective or occlusive element) can be directly bonded to a corresponding non-conductive or dielectric field region (e.g. 341B) of a second element (e.g., an active chip) without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface (e.g. 315) that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of hybrid bonding techniques, such as Direct Bond Interconnect, or DBI®, available commercially from Xperi of San Jose, CA, can enable high density of pads connected across the direct bond interface (e.g., small or fine pitches for regular arrays).

In some embodiments, the pitch of the bonding pads, or conductive traces embedded in the bonding surface of one of the bonded elements, may be less 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die or singulated protective element. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

In one aspect, a bonded structure is provided. The bonded structure includes a semiconductor element, including active circuitry (e.g. 116). The bonded structure also includes a protective element directly bonded to the semiconductor element without an adhesive along a bonding interface. The protective element includes an obstructive layer (i.e. 305) configured to inhibit external access to at least a portion of the active circuitry. The protective element may also include, additionally or alternatively, a protective circuitry layer (e.g. 410) disposed within it, and the protective circuitry layer is configured to detect or disrupt external access to the protective element, the active circuitry of the semiconductor element, or both.

In some embodiments, the obstructive layer of the protective element and the active circuitry of the semiconductor element are spaced apart from one another relative to the bonding interface. In some embodiments, the spacing between the obstructive layer of the protective element and the active circuitry of the semiconductor element is between 50 micrometers and 100 micrometers. In some embodiments, the protective circuitry layer of the protective element and the obstructive layer of the protective element are spaced apart from one another along a direction transverse to the bonding interface. In some embodiments, the spacing between the protective circuitry layer and the obstructive layer of the protective element is at least 20 micrometers. In some embodiments, the protective circuitry layer of the protective element is disposed between the obstructive layer of the protective element and the bond interface. In some embodiments, the obstructive layer of the protective element is disposed between the protective circuitry layer of the protective element and the bond interface. In some embodiments, the obstructive layer of the protective element includes an occlusive layer configured to occlude a predefined area of the semiconductor element in the plane parallel to the layer's surface. In some embodiments, the protective element includes a bonding layer directly bonded to a bonding layer of the semiconductor element. In some embodiments, the bonding layer of the protective element is metallized in a pattern that matches at least a portion of a metallization pattern of a bonding layer of the protective element. In some embodiments, the bonding layer of the semiconductor element includes a number of contact pads disposed in a nonconductive layer, and the bonding layer of the protective element includes a number of contact pads disposed in a nonconductive layer directly bonded to the contact pads of the semiconductor element. In some embodiments, the bonding layer of the protective element and the protective circuitry layer of the protective element are connected through one or more vertical interconnects (e.g. 360). In some embodiments, the obstructive layer of the protective element includes a detection circuit configured to detect external access of the protective element. In some embodiments, the detection circuit includes a passive electronic circuit element configured to detect external access. In some embodiments, the passive electronic circuit includes a capacitive circuit element, a resistive circuit element, or both. In some embodiments, the passive electronic circuit element includes a resistive element comprising a patterned trace. In some embodiments, the passive electronic circuit element includes a capacitive element comprising a plurality of traces separated by an insulating material. In some embodiments, the detection circuit includes active circuitry. In some embodiments, a vertical interconnect extends from the detection circuit to a contact pad of the protective element. In some embodiments, a vertical interconnect extends from the detection circuit to the protective circuitry layer of the protective element. In some embodiments, one or more contact pads of the protective element are bonded to a contact pad at an active side of the semiconductor element. In some embodiments, the protective circuitry layer of the protective element includes a passive electronic circuit configured to mimic the appearance of active circuitry. In some embodiments, the protective circuitry layer of the protective element includes active circuitry. In some embodiments, the active circuitry of the protective circuitry layer is configured to emit an encrypted timing signal. In some embodiments, the active circuitry of the protective circuitry layer is configured to detect changes to the protective circuitry layer. In some embodiments, the active circuitry of the protective circuitry layer is configured to disable the active circuitry of the semiconductor when it detects a change to the protective circuitry layer. In some embodiments, the protective circuitry layer is configured to emit an alarm signal when the active circuitry of the protective circuitry layer detects a change to the protective circuitry layer. In some embodiments, a vertical interconnect extends from the protective circuitry layer to a contact pad of the protective element. In some embodiments, the protective element is directly bonded to a back side (e.g. 112) of the semiconductor element opposite an active side (e.g. 114), and a through semiconductor via (e.g. 330) extends from a contact pad at or near the active side of the semiconductor element to a contact pad of the protective element providing electrical communication between the semiconductor element and the protective circuitry layer of the protective element. In some embodiments, the protective circuitry layer is completely embedded within the protective element.

In another aspect, a method is provided for forming a bonded structure. The method includes directly bonding a semiconductor element to a protective element without an adhesive. The semiconductor element includes active circuitry, and the protective element includes an obstructive layer configured to inhibit external access to a portion of the active circuitry and a protective layer configured to detect or disrupt external access to the protective element, the semiconductor element, or both.

In some embodiments, the method includes forming the protective element such that the obstructive layer of the protective element and the protective layer of the protective element are spaced apart from one another along a direction transverse to the bonding interface. In some embodiments, the method includes forming the protective element such that the spacing between the obstructive layer and the protective layer is at least 20 micrometers. In some embodiments, the method includes forming the protective element such that the spacing between the obstructive layer of the protective element and the active circuitry of the protective element is at least 20 micrometers. In some embodiments, the method includes forming the protective element to include a bonding layer, forming the semiconductor element to include a bonding layer, and bonding the bonding layer of the protective element to the bonding layer of the semiconductor element. In some embodiments, the method includes forming the protective element such that the bonding layer of the protective element is metallized to match a metallization pattern of the semiconductor element. In some embodiments, the method includes forming the protective element such that the bonding layer of the protective element includes a number of contact pads disposed in a nonconductive layer configured to mirror a plurality of contact pads of the bonding layer of the semiconductor element. In some embodiments, the method includes forming the protective element such that the obstructive layer includes a detection circuit configured to detect external access to the protective element. In some embodiments, the method includes forming the protective element to include a vertical interconnect extending from the detection circuit to a contact pad of the protective element. In some embodiments, the method includes directly bonding the protective element to a back side of the semiconductor element that is directly opposite an active side of the semiconductor element, and forming the semiconductor element to include a through semiconductor via (TSV) extending from a contact pad at or near the active side of the semiconductor to a contact pad of the protective element such that the TSV provides electrical communication between the semiconductor element and the detection circuit. In some embodiments, the method includes forming the protective element to include a vertical interconnect extending from the detection circuit to the protective layer of the protective element, and a second vertical interconnect extending from the protective layer of the protective element to a contact pad of the protective element. In some embodiments, the method includes forming the protective circuitry layer to include a passive electronic circuit configured to mimic the appearance of active circuitry. In some embodiments, the method includes forming the protective circuitry layer to include active circuitry. In some embodiments, the method includes configuring the active circuitry of the protective circuitry layer to emit an encrypted timing signal. In some embodiments, the method includes configuring the active circuitry of the protective circuitry layer to detect changes to the protective circuitry layer. In some embodiments, the method includes configuring the active circuitry of the protective circuitry layer to disable the active circuitry of the semiconductor element when the active circuitry of the protective circuitry layer detects a change to the protective circuitry layer. In some embodiments, the method includes configuring the active circuitry of the protective circuitry layer to emit an alarm signal when the active circuitry of the protective circuitry layer detects a change to the protective circuitry layer. In some embodiments, the method includes forming the protective element to include a vertical interconnect extending from the protective circuitry layer to a contact pad of the protective element. In some embodiments, the method includes directly bonding the protective element to a back side of the semiconductor element that is directly opposite an active side of the semiconductor element, and forming the semiconductor element to include a through semiconductor via (TSV) extending from a contact pad at or near the active side of the semiconductor to a contact pad of the protective element such that the TSV provides electrical communication between the semiconductor element and the protective layer of the protective element. In some embodiments, the method includes forming the protective element such that the protective circuitry layer is completely embedded within the protective element.

In another aspect, a bonded structure is provided. The bonded structure includes a semiconductor element that includes active circuitry, and a protective element that is directly bonded to the semiconductor element without an adhesive along a bonding interface. The protective element includes a protective circuitry layer configured to detect or disrupt external access to the protective element, the active circuitry of the semiconductor element, or both.

In some embodiments, the protective layer of the protective element and the active circuitry of the semiconductor element are spaced apart from one another along a direction transverse to the bonding interface. In some embodiments, the spacing between the obstructive layer of the protective element and the active circuitry of the semiconductor element is at least 20 micrometers. In some embodiments, the protective element includes a bonding layer, and the semiconductor element includes a bonding layer directly bonded to the bonding layer of the protective element. In some embodiments, the bonding layer of the protective element is metallized to match a metallization pattern of the semiconductor element. In some embodiments, the bonding layer of the semiconductor element includes a number of contact pads disposed in a nonconductive layer, and the bonding layer of the protective element includes a number of contact pads disposed in a nonconductive layer directly bonded to the contact pads of the semiconductor element. In some embodiments, the protective layer of the protective element includes a passive electronic circuit configured to mimic the appearance of active circuitry. In some embodiments, the protective layer of the protective element includes active circuitry. In some embodiments, the active circuitry of the protective circuitry layer is configured to emit an encrypted timing signal. In some embodiments, the active circuitry of the protective circuitry layer is configured to detect changes to the protective element. In some embodiments, the active circuitry of the protective circuitry layer is configured to disable the active circuitry of the semiconductor element when the active circuitry of the protective circuitry layer detects a change to the protective element. In some embodiments, the protective circuitry layer is configured to emit an alarm signal when it detects a change to the protective element. In some embodiments, the bonded structure includes a vertical interconnect extending from the protective layer of the protective element to a contact pad of the protective element. In some embodiments, the protective element is directly bonded to a back side of the semiconductor element opposite an active side, and a through semiconductor via (TSV) extends from a contact pad at or near the active side of the semiconductor element to a contact pad of the protective element, such that the TSV provides electrical communication between the semiconductor element and the protective layer of the protective element. In some embodiments, the protective circuitry layer of the protective element is completely embedded within the protective element.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
   a semiconductor element comprising active circuitry; and
   a protective element comprising a second semiconductor element directly bonded to the semiconductor element without an adhesive along a bonding interface, the second semiconductor element comprising:
   an obstructive layer configured to inhibit external access to at least a portion of the active circuitry; and
   a protective circuitry layer disposed within the protective element, the protective circuitry layer configured to detect or disrupt external access to the active circuitry of the semiconductor element.

2. The bonded structure of claim 1, wherein the protective element is directly bonded to a back side of the semiconductor element opposite an active front side of the semiconductor element, the active circuitry of the semiconductor element disposed closer to the active front side than to the back side.

3. The bonded structure of claim 1, wherein the obstructive layer of the protective element and the active circuitry of the semiconductor element are spaced apart from one another along a direction transverse to the bonding interface.

4. The bonded structure of claim 1, wherein a spacing between the obstructive layer of the protective element and the active circuitry of the semiconductor element is at least 20 micrometers.

5. The bonded structure of claim 1, wherein a spacing between the obstructive layer of the protective element and the active circuitry of the semiconductor element is between 50 micrometers and 100 micrometers.

6. The bonded structure of claim 1, wherein the protective circuitry layer of the protective element and the obstructive layer of the protective element are spaced apart from one another along a direction transverse to the bonding interface.

7. The bonded structure of claim 6, wherein the spacing between the protective circuitry layer of the protective element and the obstructive layer of the protective element is at least 20 micrometers.

8. The bonded structure of claim 1, wherein the protective circuitry layer of the protective element is disposed between the obstructive layer of the protective element and the bonding interface.

9. The bonded structure of claim 1, wherein the obstructive layer of the protective element is disposed between the protective circuitry layer of the protective element and the bonding interface.

10. The bonded structure of claim 1, wherein the obstructive layer of the protective element further comprises an occlusive layer configured to occlude a predefined area of the semiconductor element in a plane parallel to a surface of the occlusive layer.

11. The bonded structure of claim 1 wherein the obstructive layer of the protective element comprises a detection circuit configured to detect external access of the protective element.

12. The bonded structure of claim 11, wherein the detection circuit comprises a passive electronic circuit element configured to detect the external access.

13. The bonded structure of claim 12, wherein the passive electronic circuit element comprises at least one of a capacitive circuit element and a resistive circuit element.

14. The bonded structure of claim 13, wherein the passive electronic circuit element comprises the resistive circuit element, and wherein the resistive circuit element further comprises a patterned trace.

15. The bonded structure of claim 13, wherein the passive electronic circuit element comprises the capacitive circuit element, and wherein the capacitive circuit element further comprises a plurality of traces separated by an insulating material.

16. The bonded structure of claim 11, wherein the detection circuit further comprises active circuitry.

17. A bonded structure comprising:
    a semiconductor element comprising first active circuitry; and
    a protective element comprising a second semiconductor element directly bonded to the semiconductor element without an adhesive along a bonding interface, the second semiconductor element comprising a protective circuitry layer disposed within the protective element, the protective circuitry layer having second active circuitry configured to detect or disrupt external access to the first active circuitry of the semiconductor element.

18. The bonded structure of claim 17, wherein the protective element further comprises a bonding layer, and wherein the semiconductor element further comprises a bonding layer directly bonded to the bonding layer of the protective element.

19. The bonded structure of claim 18, wherein the bonding layer of the protective element is metallized to match a metallization pattern of the semiconductor element.

20. The bonded structure of claim 19, wherein the bonding layer of the semiconductor element comprises a plurality of contact pads disposed in a nonconductive layer, and wherein the bonding layer of the protective element comprises a plurality of contact pads disposed in a nonconductive layer directly bonded to the plurality of contact pads of the semiconductor element.

21. The bonded structure of claim 17, wherein the protective circuitry layer of the protective element further comprises a passive electronic circuit configured to mimic an appearance of active circuitry.

22. The bonded structure of claim 17, wherein the second active circuitry of the protective circuitry layer is configured to detect changes to the protective element.

23. The bonded structure of claim 22, wherein the second active circuitry of the protective circuitry layer is configured to disable the first active circuitry of the semiconductor element when the second active circuitry of the protective circuitry layer detects a change to the protective element.

24. The bonded structure of claim 22, wherein the protective circuitry layer is configured to emit an alarm signal when the second active circuitry of the protective circuitry layer detects a change to the protective element.

25. The bonded structure of claim 17, further comprising a vertical interconnect extending from the protective circuitry layer of the protective element to a contact pad of the protective element.

26. The bonded structure of claim 25, wherein the protective element is directly bonded to a back side of the semiconductor element opposite an active side, the bonded structure further comprising a through semiconductor via (TSV) extending from a contact pad at or near the active side of the semiconductor element to the contact pad of the protective element, the TSV providing electrical communication between the semiconductor element and the protective circuitry layer of the protective element.

27. The bonded structure of claim 17, wherein the protective circuitry layer of the protective element is completely embedded within the protective element.

28. The bonded structure of claim 1, wherein the active circuitry comprises one or more transistors.

29. The bonded structure of claim 1, wherein the protective circuitry layer comprises one or more transistors.

\* \* \* \* \*

UNITED STATES PATENT AND TRADEMARK OFFICE
CERTIFICATE OF CORRECTION

PATENT NO. : 12,300,634 B2
APPLICATION NO. : 17/816346
DATED : May 13, 2025
INVENTOR(S) : Belgacem Haba et al.

Page 1 of 1

It is certified that error appears in the above-identified patent and that said Letters Patent is hereby corrected as shown below:

In the Specification

Column 4, Line 32, delete "to aback side" and insert -- to a back side --.

In the Claims

Column 18, Line 7, Claim 7, delete "wherein the spacing" and insert -- wherein a spacing --.

Signed and Sealed this
Nineteenth Day of August, 2025

Coke Morgan Stewart
*Acting Director of the United States Patent and Trademark Office*